United States Patent [19]
Nakayoshi

[11] Patent Number: 5,893,755
[45] Date of Patent: Apr. 13, 1999

[54] METHOD OF POLISHING A SEMICONDUCTOR WAFER

[75] Inventor: Yuichi Nakayoshi, Kanagawa, Japan

[73] Assignee: Komatsu Electronic Metals Co., Ltd., Kanagawa, Japan

[21] Appl. No.: 08/865,892

[22] Filed: May 30, 1997

[30] Foreign Application Priority Data

May 31, 1996 [JP] Japan ................................. 8-175346

[51] Int. Cl.$^6$ ............................................. H01L 21/302
[52] U.S. Cl. ............... 438/692; 451/285; 451/41; 451/283
[58] Field of Search ................ 451/285, 41, 283; 438/692, 693

[56] References Cited

U.S. PATENT DOCUMENTS

| | | |
|---|---|---|
| 4,910,155 | 3/1990 | Cote et al. ........................ 437/225 |
| 5,232,875 | 8/1993 | Tuttle et al. ..................... 437/225 |
| 5,736,427 | 4/1998 | Henderson ....................... 438/692 |

*Primary Examiner*—Olik Chaudhuri
*Assistant Examiner*—Edwin Oh
*Attorney, Agent, or Firm*—Sughrue, Mion, Zinn, Macpeak & Seas, PLLC

[57] ABSTRACT

A method of polishing semiconductor wafers is provided. The method will not impair the original (pre-polishing) contour of semiconductor wafers, and semiconductor wafers can be polished so as to have high flatness. In the method according to this invention, a silicon rubber sheet 2 is fixed on a base 4, and an abrasive cloth 5 is secured on the silicon rubber sheet 2. A template 1 of thickness close to that of a semiconductor wafer 10 is secured on a backing pad 32. The semiconductor wafer 10 is restrained by the template 1 and is impelled in to contact with the abrasive cloth 5 to polish effectively.

6 Claims, 3 Drawing Sheets

METHOD OF POLISHING A SEMICONDUCTOR WAFER

BACKGROUND OF THE INVENTION

1. Field of the Invention

The present invention relates to a method of polishing a semiconductor wafer being retained by a template.

2. Description of Prior Art

To enhance working efficiency and prevent environmental pollution, semiconductor manufacturing processes have been increasingly utilized to polish a semiconductor wafer retained by a template without using wax.

The process of polishing a semiconductor wafer by the aid of a template is shown in FIG. 5. As shown in FIG. 5, a semiconductor wafer 10 is retained by a template 1a, and an abrasive cloth 5 secured on a base 4 is pressed in to contact with the semiconductor wafer 10 to facilitate polishing. To take the machining allowance of semiconductor wafers into consideration, the thickness of the template 1a is made 100 µm thinner than that of the semiconductor wafer 10 to allow the semiconductor wafer 10 to be polished entirely.

Due to the enhancement in techniques of lapping and plane grinding, the preparation of semiconductor wafers with high flatness has recently resorted to the procedure of polishing. However, in the above-described conventional polishing operation, as shown in FIG. 4, waviness 12b will occur on the polished surface 11b and the outer periphery of the semiconductor wafer 10 will become steeply inclined. Therefore, the TTV of the semiconductor wafer 10 will become worse.

SUMMARY OF THE INVENTION

In view of the above-described defects, the object of the present invention is to provide a method of polishing semiconductor wafers, which will not impair the original (before polishing) contour of semiconductor wafers and will allow semiconductor wafers to be polished with high flatness.

According to the method of this invention, in the procedure of bringing an abrasive cloth secured on a base in to contact with a semiconductor wafer restrained by a template so as to facilitate polishing operation, a resilient sheet is inserted between the base and the abrasive cloth.

By inserting a resilient sheet (for example, silicon rubber sheet) between the base and the abrasive cloth, waviness on the surfaces of finished semiconductor wafers can be eliminated. At the same time, by employing a template with a thickness close to that of the semiconductor wafers being restrained thereby, the forces incurred on the surface of a semiconductor wafer during polishing operation can be equalized.

By this arrangement, the contour of the semiconductor wafer coming from the preceding step will not be impaired during polishing. In particular, semiconductor wafers with high flatness, obtained by lapping or plan grinding, can be polished to produce high-quality semiconductor wafers.

BRIEF DESCRIPTION OF THE DRAWINGS

The present invention can be more fully understood by reading the subsequent detailed description and examples with references made to the accompanying drawings, wherein.

DETAILED DESCRIPTION OF THE PREFERRED EMBODIMENT

For easy comparison between this invention and the conventional technology, the polishing operation is divided into two steps. The method of polishing semiconductor wafers according to this invention is explained by the aid of comparing the semiconductor wafer contours appearing immediately after each of the two steps.

Figure 3:
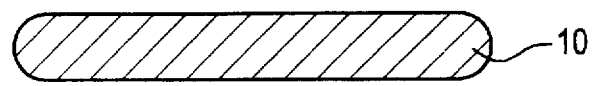
FIG. 3 is a side cross-sectional view showing the contour of a semiconductor wafer before polishing.

At the time of polishing as shown in FIG. 3, the semiconductor wafer 10 has a high degree of flatness is prepared.

Figure 1A:
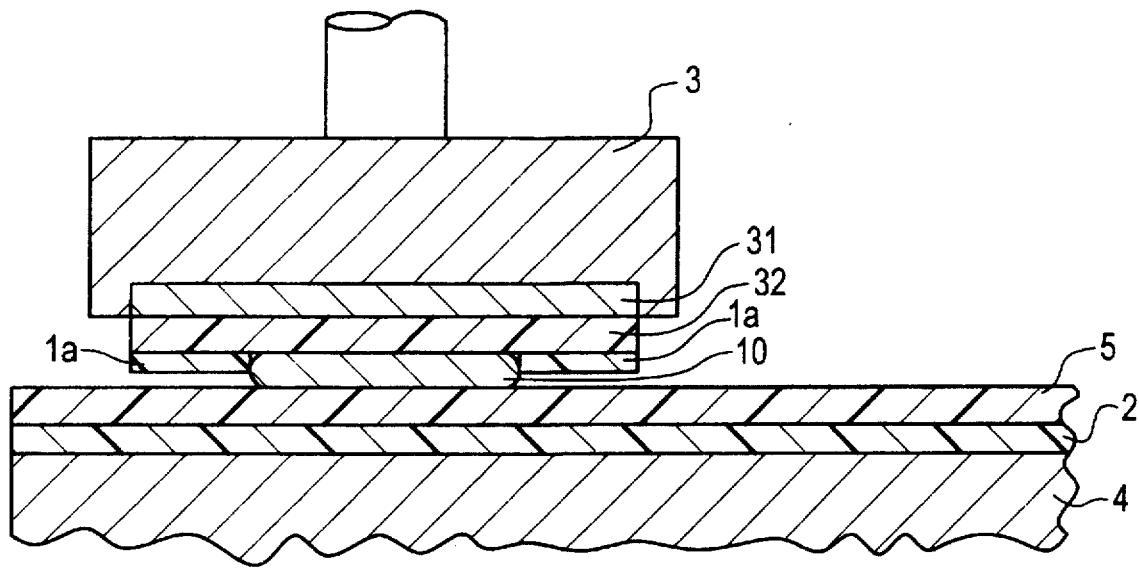
FIGS. 1a and 1b are schematic drawings showing the method of polishing semiconductor wafers according to this invention.

As shown in FIG. 1(a), in the beginning of polishing operation, the semiconductor wafer 10 is kept at its position and a backing pad 32 is fixed on a ceramic plate 31 which is the bottom portion of a top ring 3. The top ring 3 is used to impel the semiconductor wafer 10 toward an abrasive cloth 5. Then, same as conventional technology, a template 1a of thickness less than that of the semiconductor wafer 10, is fixed on the backing pad 32. By this arrangement, the semiconductor wafer 10 is restrained within the template 1a.

The abrasive cloth 5 is secured on a silicon rubber sheet 2 which is in turn secured on a ceramic made base 4.

The thickness of the silicon rubber sheet 2 is preferably held between 0.5 mm and 3.0 mm, the stability of its polishing surface will be impaired if the thickness is greater than 3.0 mm.

The polishing operation can be started by lowering the top ring 3 to impel the semiconductor wafer 10 in to contact with the abrasive cloth 5.

Figure 2A:
FIGS. 2a and 2b are side cross-sectional views showing the contour of a semiconductor wafer polished according to the method of this invention.
Figure 2B:
Figure 4:
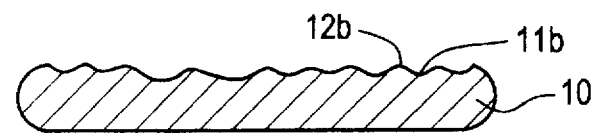
FIG. 4 is a side cross-sectional view showing the contour of a semiconductor wafer polished according to conventional methods.
Figure 5:
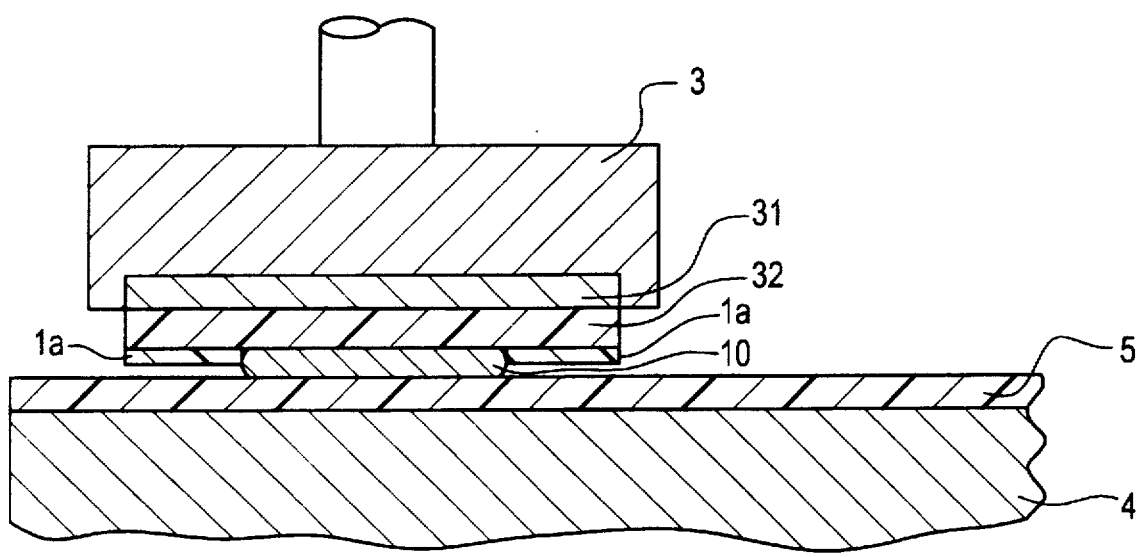
FIG. 5 is a schematic drawing showing a conventional method of polishing semiconductor wafers.

As shown in FIG. 2(a), waviness 12b (see FIG. 4) incurred during conventional polishing is eliminated and the polished surface 11a of the semiconductor wafer 10 is smooth after polishing. However, its outer periphery rises and has a curved shape.

Figure 1B:
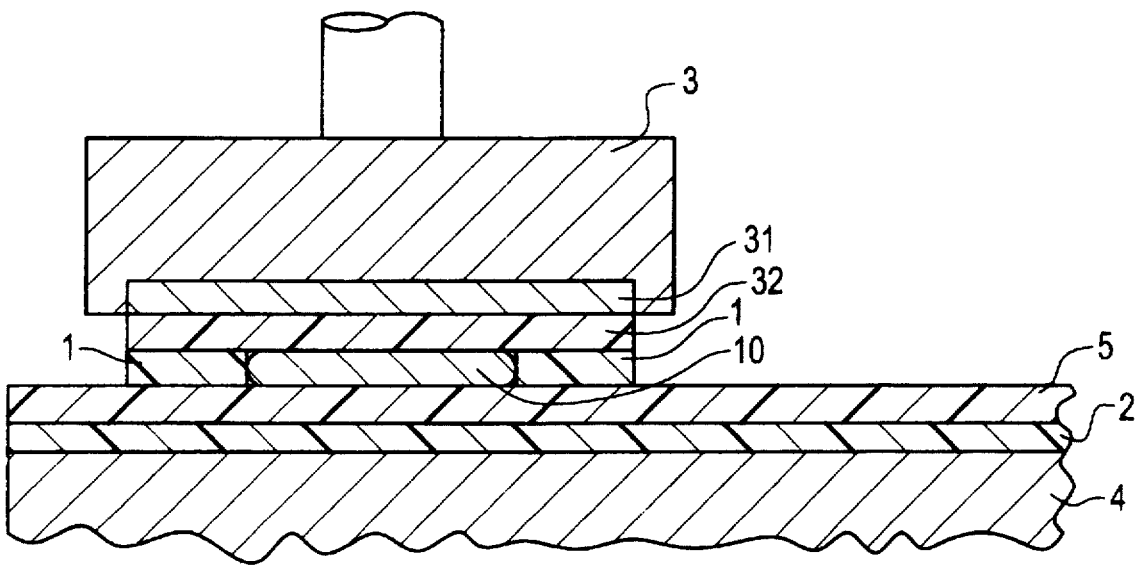

In light of the above-described defect, as shown in FIG. 1(b), the template 1a is substituted by a template 1 of thickness close to that of the semiconductor wafer 10. The template 1 is fixed on the backing pad 32, and the semiconductor wafer 10 is restrained by the template 1. The same procedure as described above is followed, wherein the semiconductor wafer 10 is subsequently impelled into contact with the abrasive cloth 5 secured on the silicon rubber sheet 2 to perform the polishing.

In the polishing procedure shown in FIG. 1(b), being impelled by the top ring 3, both of the semiconductor wafer 10 and the template 1 are brought into contact with abrasive cloth 5 to undergo polishing. Therefore, the polishing pressure exerted on the whole surface of the semiconductor wafer 10 is unbiased, and the contour of the semiconductor wafer 10 before polishing will not be impaired. Hence, the semiconductor wafer 10 can be polished into a flat shape.

Furthermore, taking the factor of contact with the abrasive cloth 5 into consideration, the thickness of the template 1 is preferably equal to that of the semiconductor wafer 10 before polishing. However, it is not obligatory to choose templates, one by one, through strictly matching their thickness with that of each semiconductor wafer to be polished. Furthermore, in view of the machining allowance (about 2–15 μm) of polishing, the absolute value of thickness difference between the semiconductor wafer and the template is suitably below 100 μm, preferably below 50 μm, and more willingly below 20 μm.

Furthermore, in the above embodiment, a silicon rubber sheet 2 is inserted between the base 4 and the abrasive cloth 5. However, not only silicon rubber sheet, any sheet with a hardness value ranging from 20 to 90° measured according to the specification K6301 (A type) of JIS can be used to obtain the same result. Furthermore, the hardness value is preferably between 30 and 60°. Therefore, sheets made of, for example, fluoride rubber or acrylic rubber can be used, and one more layer or multiple layers of abrasive cloths can also be inserted therebetween.

Due to the fact that this invention is constructed as described above, the waviness and the raising of periphery occurred in the polished surfaces of semiconductor wafers during conventional polishing operations can be eliminated and thus a high degree of flatness can be achieved through polishing.

What is claimed is:

1. A method of polishing a semiconductor wafer, in which an abrasive cloth secured on a base is impelled in to contact with a semiconductor wafer restrained by a template to facilitate polishing, wherein a resilient sheet is inserted between the base and the abrasive cloth.

2. The method of polishing a semiconductor wafer, as claimed in claim 1, wherein the semiconductor wafer is restrained by the template having a thickness substantially equal to that of the semiconductor wafer.

3. The method of polishing a semiconductor wafer, as claimed in claim 1, wherein the resilient sheet is a silicone rubber sheet.

4. The method of polishing a semiconductor wafer, as claimed in claim 2, wherein the difference between thickness of the semiconductor wafer and that of the template is less than 100 μm.

5. The method of polishing a semiconductor wafer, as claimed in claim 1, wherein the hardness value of the resilient sheet ranges from 20 to 90° measured according to the specification K6301 (A type) of JIS.

6. The method of polishing a semiconductor wafer, as claimed in claim 3, wherein the thickness of the silicone rubber sheet is between 0.5 mm and 3.0 mm.

* * * * *